United States Patent [19]

Derryberry et al.

[11] Patent Number: 4,890,194
[45] Date of Patent: * Dec. 26, 1989

[54] A CHIP CARRIER AND MOUNTING STRUCTURE CONNECTED TO THE CHIP CARRIER

[75] Inventors: Lesli A. Derryberry; Charles E. Williams, both of Dallas, Tex.

[73] Assignee: Texas Instruments Incorporated, Dallas, Tex.

[*] Notice: The portion of the term of this patent subsequent to Jun. 7, 2005 has been disclaimed.

[21] Appl. No.: 161,572

[22] Filed: Feb. 28, 1987

Related U.S. Application Data

[63] Continuation of Ser. No. 801,038, Nov. 22, 1985, Pat. No. 4,750,089.

[51] Int. Cl.⁴ .......................... H05K 7/20; H05K 5/06
[52] U.S. Cl. ................................... 361/386; 174/16.3; 174/52.4; 165/185; 357/81; 361/398; 361/400
[58] Field of Search ................. 174/16.3, 52.3, 52.4; 165/80.3, 185; 357/81; 361/306–308, 398, 400, 403, 414, 417, 419–420

[56] References Cited

U.S. PATENT DOCUMENTS 4,573,103 2/1986 Nilsson ........................... 174/52 FP
4,750,089 6/1988 Derryberry et al. ........... 174/16 HS

FOREIGN PATENT DOCUMENTS 59-188948 10/1984 Japan ..................................... 357/81

Primary Examiner—Gregory D. Thompson
Attorney, Agent, or Firm—John D. Kling; Rene E. Grossman; Melvin Sharp

[57] ABSTRACT

A chip carrier including a connecting strip is supported by a thermally conductive spacer block under its center, which provides a mechanical connection to a circuit board. The external contact pads on the underside of the chip carrier are not bonded directly to traces on the board, but instead are bonded to the connecting strip which is formed from a polymer layer having conductive traces thereon. The conductive traces may be bonded to traces on the circuit board.

19 Claims, 4 Drawing Sheets

A CHIP CARRIER AND MOUNTING STRUCTURE CONNECTED TO THE CHIP CARRIER

This is a continuation of application Ser. No. 801,038, filed Nov. 22, 1985, now Pat. No. 4,750,089.

BACKGROUND AND SUMMARY OF THE INVENTION

The present invention relates to methods of mounting integrated circuits on boards, to interconnect the integrated circuits in a desired macroscopic circuit configuration.

One conventional way of packaging integrated circuits (chips) is in cofired ceramic chip carriers. These carriers hermetically enclose an integrated circuit, and have metal traces (leads) which lead through the walls of the package (after it is fired) to connect internal bonding sites (from which internal leads can contact the chip bonding sites) to external contacts (which are normally at the lower edges of the chip carrier). These chip carriers have many advantages, but the technology for attaching them to the circuit board has been a limitation on their usefulness.

Conventionally, the external contacts at the bottom edges of a chip carrier have been soldered directly to traces or contact pads on a circuit board. This provides a small footprint (area of board consumed) as well as a small height, and conservation of both these dimensions is important. However, in this technology, the contacts must serve three different functions: they provide the thermal and mechanical connection of the package to the board, as well as providing the electrical connections needed. It is not possible to optimize all three of these functions in this contact structure, and several difficulties result. A further limitation of this technology is that it is not well suited to placing contacts other than at the edge of the package.

As semiconductor device lead counts have increased and higher density packaging has become a necessity, packaging concepts have been shifting from perimeter connections in the form of solder joints or rigid leads to more dense array style connections. Also, surface mounting, as opposed to the through-hole approach, has been widely accepted as the most effective way of achieving lower profiles and higher board routing densities. However, there are many problems associated with surface mounting an array style package. These are in addition to existing problems with conventional perimeter style surface mounting of leadless chip carriers. The present invention eliminates many of these problems and alleviates others (most importantly the inspectability problem) and can be used on custom pad grid array packages as well as JEDEC standard perimeter pad leadless chip carriers.

The present invention teaches a novel method and structure for attaching a chip carrier (e.g. a cofired ceramic pad grid array package, or a standard leadless chip carrier (LCC) with contacts around its lower edges only) to a circuit board. The chip carrier may be of the type having a body composed of multilayered fused ceramic. Furthermore, the chip carrier may include, for example, a body fired from three or more layers of alumina, with the first level interconnect (from die to chip carrier) made using TAB technology or more conventional wire bonding, and with a Kovar lid soldered on to effect a hermetic seal. The underside of the chip carrier may have, for example, an array of gold plated pads (a pad grid configuration), or may have more conventional perimeter contacts; but in the center of the underside the present invention teaches that a thermally conductive spacer block should be used.

This spacer block does not have to be an electrical insulator. For example, a small molybdenum block brazed onto the underside of the chip carrier is a preferred embodiment of this spacer. The spacer block provides the primary mechanical attachment between the chip carrier and the board, and also serves as a thermal spreader to aid in the dissipation of the heat generated by the chip. The spacer block may be initially attached to the chip carrier or initially attached to the board; but what is important is that the mechanical and thermal connections can now be performed separately from the electrical connection.

The electrical connection is preferably performed by an adaptation of TAB technology. The technique known as TAB (Tape Automated Bonding) has previously been used to attach bonding leads to chips. In this technique a flexible sheet (e.g. of polyimide) carries a number of conductive traces which are bonded to the bond pads on an integrated circuit at one end, and bonded to (for example) the bonding sites on the interior bonding shelf of a chip carrier containing the chip at the other end. Typically the TAB strip will have a hole in its middle for the chip, and will have traces extending outward more or less radially from the perimeter of this hole to the outer edge of the TAB strip. Where contacts are to be made, the traces may extend somewhat beyond the polymer supporting sheet.

The present invention teaches that electrical connections from the chip carrier to the circuit board should be made, separately from the thermal and primary mechanical connections, by using a modification of TAB technology. The chip carrier is connected to the board by connecting strip, which is a very thin sheet of polymer (e.g. polyimide) with a network of copper traces photographically etched on one or both faces. The connecting strip is attached to the array of pads on the underside of the chip carrier by any of several possible methods. The assembly (chip carrier with spacer block and connecting strip attached) is then aligned on the board, and the spacer block is attached to the board using solder, RTV (room-temperature vulcanizer, i.e. rubber cement) epoxy, or other method. Finally, the connecting strip is connected to matching pads on the board (preferably by soldering, to permit rework if necessary).

Note that the power traces in the connecting strip can have different widths or thicknesses from the signal traces, and that some rudimentary routing (distribution) is possible by extending or curving the traces on the connecting strip. That is, with the present invention it is not necessary for all the connecting strips to terminate approximately the same distance from the chip.

It should also be noted that other electrical connection technologies could be substituted for the connecting strip technology described here. That is, one of the key teachings of the present invention is that the thermal connection and electrical connection from chip carrier to board should follow separate paths, and many advantages derive from this separation. Moreover, although some mechanical support may be derived frpm the tensile strength of the connecting strip, the primary mechanical support is also separated from the electrical connection structure; and this is another generally applicable teaching of the invention, which can be used without using the specific connecting strip technology describe here as preferable.

A few of the key advantages resulting from this novel configuration will now be discussed.

Major criteria in any packaging configuration include inspectability, testability, and stability over thermal cycling. The present invention provides major advantages in all these areas, including at least the following:

The present invention provides an assembly which is fully testable and available for qualification at the sealed package level. The sealed chip carrier can be connected to a reasonably conventional burn-in socket before the connecting strip is attached, or test fixtures which will contact the traces on the connecting strip could be used for testing after the connecting strip has been attached.

Test clips can, in many applications, be more easily applied to a chip carrier mounted on board. The connecting strips will typically reach out to make contact to the board beyond the edge of the chip carrier, whereas in the prior art the connection points between chip carrier and board would be right at the edge of the carrier, and thus it would be difficult to reach exactly along the walls of the chip carrier to reach the solder joints.

Second level interconnections at the chip carrier end and the board end are completely inspectable. This has been a major stumbling block in the development of space-saving array style packages. That is, the interconnections between the connecting strip and the carrier can be easily inspected before the carrier is mounted to the board, and the interconnections between the connecting strip and the board can be easily inspected after the carrier is mounted to the board.

The present invention provides greater flexibility in board layout than is permitted by standard leadless chip carriers or other surface mountable packages. Since the locations of electrical connections are not dictated by structural needs they can be located at the location which is electrically most advantageous, since routing can be done on the connecting strip to extend a trace to a convenient location.

Power and ground leads on the connecting strip can be increased in width, to provide a low resistance connection from the chip carrier to the board.

The interconnects are inherently electrically efficient. The copper used as the electrical conductor has a very low resistivity and the polyimide has a very low dielectric constant.

The overall package configuration has a low physical profile, equal to or less than that of any other surface mount configuration. The height required for the spacer block under the chip carrier will in some embodiments be no more than the clearance caused by the solder bumps under a conventionally mounted leadless chip carrier package.

The present invention allows very high density packaging—the output pad array on the underside of the chip carrier could be spaced as densely as 0.025 inch centers using existing technology, and closer spacings will be possible in future production technology.

The configuration of the present invention is more reworkable than a standard surface mountable package. Less heat will be required to reflow the solder, since
(1) the joints are easily accessible, and
(2) the connecting strip thermally isolates the joint from the chip carrier which, under normal circumstances, acts as a heat sink.

The problem of solder joints breaking due to shear forces (generated under thermal cycling by thermal coefficient of expansion (TCE) mismatch between board and chip carrier) is greatly reduced, for several reasons.
(1) In the present invention, the electrical connections are not exposed to these shear forces at all.
(2) In the present invention, direct TCE match from chip to board is not as critical: instead, this strain-generating interface is separated into two parts, namely carrier-to-spacer and spacer-to-board. Thus, if the spacer is chose from a material which has a TCE intermediate between the carrier and the board, the strain generated at each interface is reduced.
(3) Even for a given degree of TCE mismatch, less shear force is generated, since the spacer is not as wide as the carrier.
(4) The spacer block provides a stronger structural mount than typical solder joints.

Since the mechanical connections are not held by solder, stronger materials can be used. This is particularly advantageous in environments which may combine high temperatures, vibration, and lateral acceleration.

The present invention is applicable to a wide variety of board technologies. Moreover, since the requirements of thermal match between chip carrier and board are eased, it may now be possible to use board constructions which have good thermal conductivity, good mechanical strength, and good electrical routing properties, but which were not previously practicable due to thermal expansion mismatch. Moreover, it may now be possible to eschew some of the very expensive sandwich-structured board compositions which have been used to achieve an acceptable thermal match.

According to the present invention there is provided: A circuit board comprising: a substrate; a plurality of chip carriers mounted on said circuit board substrate; and a plurality of traces on said circuit board interconnecting said chip carriers in the desired macroscopic electrical circuit configuration; at least some of said chip carriers being mechanically connected to said board by a thermally conductive spacer block which is attached to the underside of said chip carrier but is smaller than said chip carrier, electrical connection between said chip carrier and said board traces being made by a connecting strip having a plurality of metallic traces thereon.

BRIEF DESCRIPTION OF THE DRAWINGS

The present invention will be described with reference to the accompanying drawings, wherein.

DESCRIPTION OF THE PREFERRED EMBODIMENTS

Figure 1A:
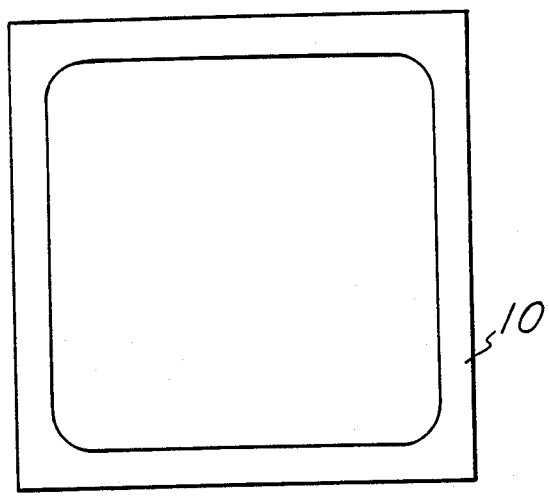
FIGS. 1A, 1B, and 1C respectively show top, section, and bottom views of a sample embodiment of a chip carrier, suitable for use in the present invention, which has a spacer block and multiple contact pads on its underside.
Figure 1B:
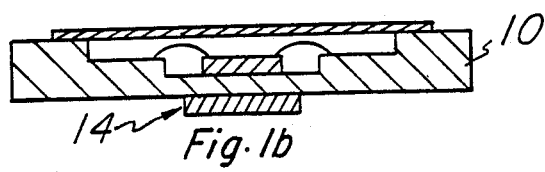
Figure 1C:
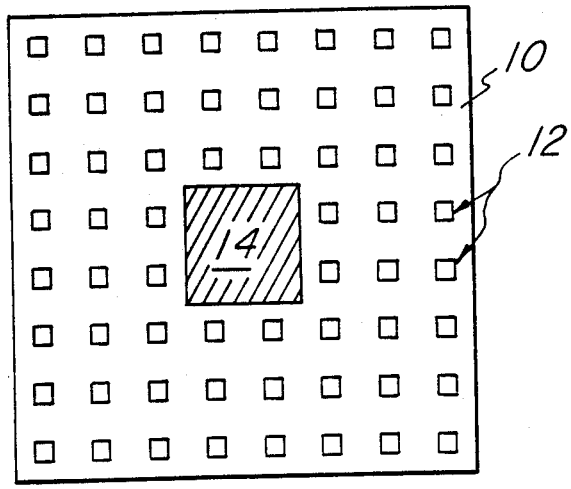

FIGS. 1A-1C show a first sample embodiment of the present invention. A chip carrier 10 having contacts 12 is mounted on a thermally conductive spacer block 14, which will be attached to a board 16 (shown in FIGS. 4A and 4B). The board 16 has patterned traces 18 on it, and it is desired to connect the external contact pads 12 on the chip carrier 10 to some of these traces 18. A connecting strip 20, having a plurality of traces 22 on it, will be attached to the underside of the chip carrier 10, as shown in FIGS. 3A-4B. Note that the connecting strip 20 leaves a space 24 in its middle, to clear the spacer block 14. In a chip carrier, this will preferably be a space of bare metal, which can be wetted by the block 14 under solder reflow conditions.

Note that the traces 22 on the connecting strip 20 may optionally extend beyond the edge of the polymer portion of the connecting strip 20. Where the contacts to the board are not required to be staggered (unlike the example shown in FIG. 4A), the polymer support structure 34 can be patterned so that the traces 22 extend beyond its edge. The consideration here is that the contacts to the chip carrier contacts 12 and to the board traces 18 occur on opposite sides of the connecting strip 20, so that some means of contracting the trace 22 on the connecting strip 20 is necessary. Trimming back the polymer provides one simple solution to this; other possibilities are, for example, to have traces on both sides of the polymer substrate, linked by vias.

Figure 2A:
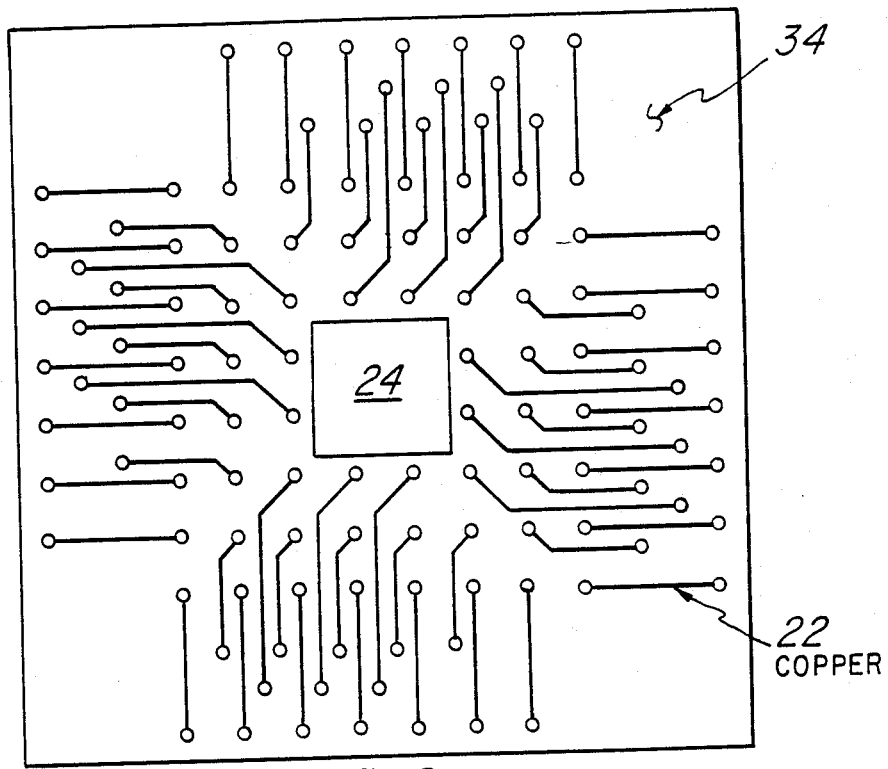
FIGS. 2A and 2B show bottom and section views, respectively, of a connecting strip suitable for use in the present invention.
Figure 2B:
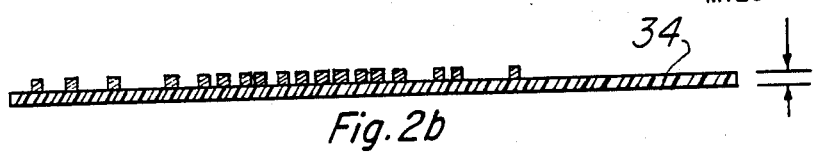
Figure 3A:
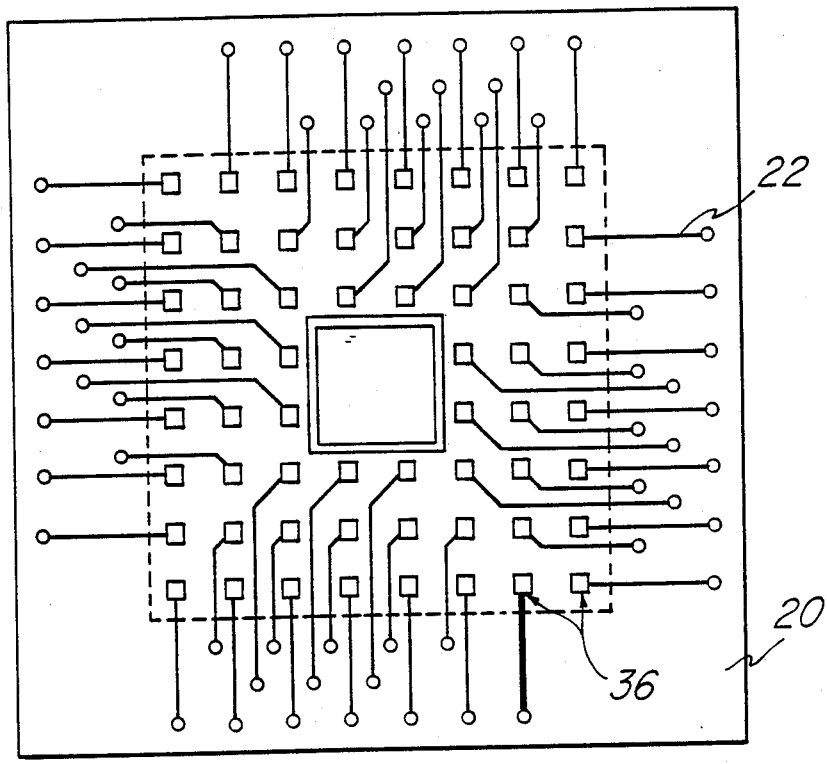
FIGS. 3A and 3B show bottom and section views, respectively, of a chip carrier assembled to a connecting strip, in accordance with the present invention, ready for mounting to a circuit board.
Figure 3B:
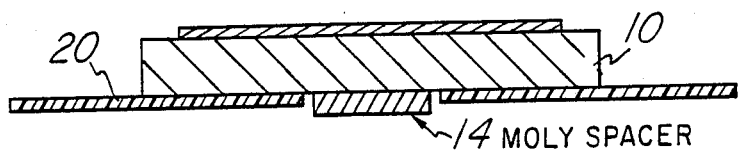
Figure 4A:
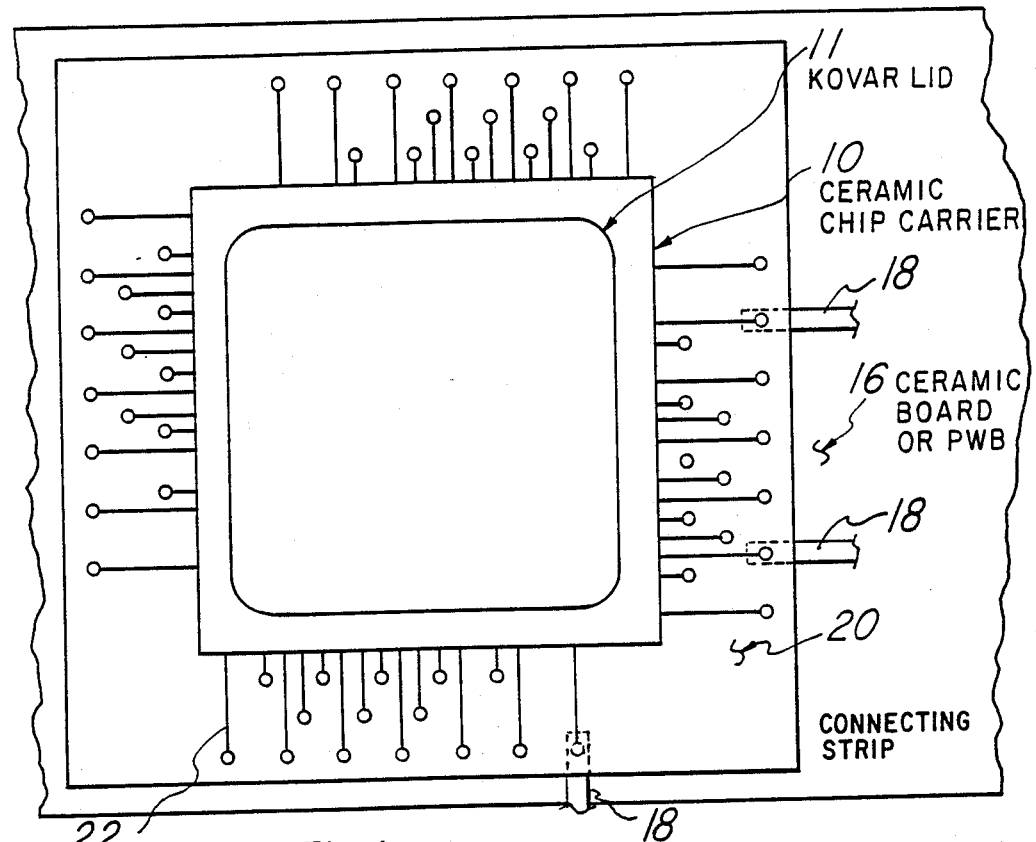
FIGS. 4A and 4B show top and section views, respectively, of a chip carrier mounted on a circuit board according to the present invention.
Figure 4B:
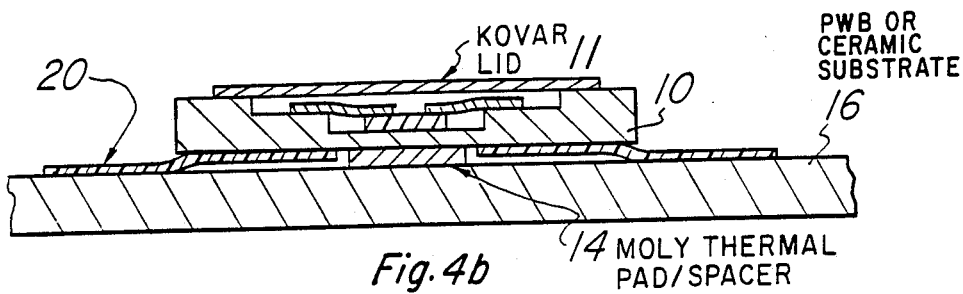

As seen in FIGS. 2A and 2B, the connecting strip 20 preferably comprises a pattern of traces 22 which are formed by etching a layer of conductive material such as copper which is overlaid on a polymer support structure 34. The traces may be, for example, one to two mils thick, and the support structure 34 may be, for example, two to five mils thick, of course these thicknesses may be widely varied as desired.

The spacer block 14 may be made of a high-temperature material such as molybdenum or Kovar, or alternatively of solder, or a wide variety of other thermal conductors can be used. Solder provides good thermal contact, and is also slightly mechanically compliant, which can be advantageous in automated assembly operations, or in high-vibration environments. Note that the solder used (in this alternative class of embodiments) for spacer block 14 should be low enough temperature solder that the chip carrier 10 does not come unsealed when the solder spacer blocks 14 (made of solder metal) are being reflowed.

A thermocompression bonder is preferably used to attach traces 22 to the carrier 10 at contact locations 36. Alternatively, solder reflow could be used instead.

As noted, the traces 22 can now be made of different widths, that is, wide traces for power leads as well as thinner traces for signal leads.

The polymer support structure 34 is preferably made of polyimide, but a wide variety of other flexible polymers could be used instead. The chief criterion on the polymer support structure is simply that it be environmentally stable, and durable enough to assemble easily.

Thus, the key steps in assembly of one chip carrier to a board according to the present invention would be as follows:

One or more chips is connected into a pad grid or standard chip carrier package, using TAB or wire bonding techniques.

The package is hermetically sealed with (for example) a Kovar lid. At this point, the package can easily be inserted into a socket for testing and burn-in.

Next, the connecting strip is bonded to the external contact pads on the underside of the chip carrier, using thermosonic, thermocompression, or solder methods. The joints thus formed are completely inspectable. The spacer block can be attached to the underside of the chip carrer at this point, or earlier or later in the process. If a high-temperature attachment is desired, the spacer block can even be attached to the chip carrier before the chip is bonded into it.

Next, the chip carrier and spacer block are aligned and attached to their desired location on the PWB or ceramic substrate, using epoxy, romm-temperature vulcanizer (rubber cement), or other attachment methods.

Finally, the connecting strip outer contacts are connected to the matching pattern on the PWB or substrate, using thermosonic, thermocompression or solder methods. Again, the joints thus formed are completely inspectable.

As will be appreciated by those skilled in the art, the present can be widely modified and varied, and its scope is not limited except as specified in the allowed claims.

What is claimed is:

1. A chip carrier suitable for mounting to a circuit board comprising:

a chip carrier comprising a body and a lid sealed together to define a totally enclosed cavity therebetween, said cavity containing at least one integrated circuit chip;

a spacer block attached to the underside of said chip carrier, said spacer block being smaller in area than the underside of said chip carrier;

a plurality of external contact pads around the perimeter of the underside of said chip carrier; and a connecting strip having a plurality of metallic traces thereon, said metallic traces having one end connected to said plurality of external contact pads and a second end suitable for attachment to said circuit board.

2. A chip carrier suitable for mounting to a circuit board comprising:

a chip carrier body including a bottom portion and side portions to define a cavity and having at least one integrated circuit chip mounted to a top surface of said bottom portion;

a lid positioned above said body and attached to the upper surface of said body to totally enclose the cavity;

a spacer block attached to a bottom surface of said bottom portion, said spacer block being smaller in area than that of said bottom surface;

a plurality of external contact pads positioned around the perimeter of said bottom surface; and a connecting strip having a plurality of metallic traces thereon, said metallic traces having one end connected to said plurality of external contact pads and a second end suitable for attachment to said circuit board.

3. The chip carrier of claim 2, wherein said spacer block is both thermally and electrically conductive.

4. The chip carrier of claim 2, wherein said spacer block comprises a refractory metal having a good thermal coefficient of expansion match to said chip carrier.

5. The chip carrier of claim 2, wherein said bottom surface is brazed onto said spacer block.

6. The chip carrier of claim 2, wherein said chip carrier body comprises a multilayer fused ceramic structure.

7. The chip carrier of claim 2, wherein said spacer block has an area which is less than 50 percent of the total area of said bottom surface.

8. An integrated circuit package suitable for mounting to a circuit board comprising:
   a chip carrier body including a bottom portion and side portions to define a cavity and having at least one integrated circuit mounted to a top surface of said bottom portion;
   a lid positioned above said body and sealed to the upper surface of said body to totally enclose the cavity;
   a spacer block attached to a bottom surface of said bottom portion, said spacer block being smaller in area than that of said bottom surface;
   a plurality of external contact pads distributed on the portion of said bottom surface which is not covered by said spacer block;
   a connecting strip having a plurality of conductive traces thereon, said conductive traces having one end connected to said plurality of external contact pads and a second end suitable for mounting to said circuit board.

9. The package of claim 8, wherein said spacer block is both thermally and electrically conductive.

10. The package of claim 8, wherein said spacer block comprises a refractory metal having a good thermal coefficient of expansion match to said chip carrier body.

11. The package of claim 8, wherein said bottom surface is brazed onto said spacer block.

12. The package of claim 8, wherein said chip carrier body comprises a multilayer fused ceramic structure.

13. The package of claim 8, wherein said spacer block has an area which is less than 50 percent of the total area of said bottom surface.

14. A chip carrier suitable for mounting to a circuit board, comprising:
    a chip carrier body including a bottom portion and side portions which define a cavity and having at least one semiconductor circuit chip mounted to a top surface of said bottom portion;
    a lid positioned above said body and attached to the upper surface of said body to totally enclose the cavity;
    a spacer block having a first surface attached to a bottom surface of said bottom portion and having a second surface for mechanical attachment to said circuit board, the area of said first surface being less than that of said bottom surface;
    a plurality of external contact pads positioned on the portion of said bottom surface which is not covered by said spacer block, for making electrical connection to conductive traces on said circuit board; and
    a connecting strip having a plurality of metallic traces thereon, said metallic traces having one end connected to said plurality of external contact pads and a second end suitable for attachment to said conductive traces.

15. The chip carrier of claim 14, wherein said spacer block is electrically conductive.

16. The chip carrier of claim 14, wherein said spacer block comprises a refractory metal having a good thermal coefficient of expansion match to said chip carrier body.

17. The chip carrier of claim 14, wherein said carrier body comprises a multilayer fused ceramic structure.

18. The chip carrier of claim 14, wherein said spacer block has an area which is less than 50 percent of the total area of said bottom surface.

19. The chip carrier of claim 14, wherein said external contact pads are positioned around the perimeter of said bottom surface.

* * * * *